US009319026B2

(12) United States Patent
Uejima (10) Patent No.: US 9,319,026 B2
(45) Date of Patent: Apr. 19, 2016

(54) HIGH-FREQUENCY MODULE

(71) Applicant: Murata Manufacturing Co., Ltd., Nagaokakyo-shi, Kyoto-fu (JP)

(72) Inventor: Takanori Uejima, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 170 days.

(21) Appl. No.: 14/094,845

(22) Filed: Dec. 3, 2013

(65) Prior Publication Data

US 2014/0091877 A1    Apr. 3, 2014

Related U.S. Application Data

(63) Continuation of application No. PCT/JP2012/065722, filed on Jun. 20, 2012.

(30) Foreign Application Priority Data

Jun. 28, 2011    (JP) ................................. 2011-142655

(51) Int. Cl.
*H03H 9/72*    (2006.01)
*H03H 9/05*    (2006.01)
(Continued)

(52) U.S. Cl.
CPC ............ *H03H 9/725* (2013.01); *H03H 9/0576* (2013.01); *H03H 9/72* (2013.01); *H04B 1/0057* (2013.01); *H04B 1/406* (2013.01)

(58) Field of Classification Search
CPC ....... H03H 9/0576; H03H 9/72; H03H 9/725; H04B 1/0057; H04B 1/406
USPC .................. 333/133, 186, 187, 188, 193–196
See application file for complete search history.

(56) References Cited

U.S. PATENT DOCUMENTS 7,298,231 B2 * 11/2007 Ikuta et al. .................... 333/133
7,515,879 B2 *  4/2009 Okabe et al. .................... 455/73
(Continued)

FOREIGN PATENT DOCUMENTS

JP    10-173568 A    6/1998
JP    2001-177431 A    6/2001
(Continued)

OTHER PUBLICATIONS

Official Communication issued in International Patent Application No. PCT/JP2012/065722, mailed on Jul. 24, 2012.
(Continued)

*Primary Examiner* — Benny Lee
*Assistant Examiner* — Jorge Salazar, Jr.
(74) *Attorney, Agent, or Firm* — Keating & Bennett, LLP (57) ABSTRACT

A high-frequency module includes a multilayer body including stacked dielectric and a pair of ground electrodes spaced apart from each other; a common terminal arranged in the multilayer body to receive and transmit communication signals; and a duplexer that is mounted on a surface of the multilayer body and that separates communication signals input and output via the common terminal. The duplexer includes a first SAW filter mounted on the surface of the multilayer body and grounded by the ground electrode and a second SAW filter mounted on the surface of the multilayer body so as to be spaced apart from the first SAW filter and is grounded by the ground electrode. Thus, degradation of isolation characteristics of the transmission and reception terminals of a splitter is prevented.

16 Claims, 10 Drawing Sheets

(51) Int. Cl.
*H04B 1/00* (2006.01)
*H04B 1/403* (2015.01)

(56) References Cited

U.S. PATENT DOCUMENTS

| | | |
|---|---|---|
| 2003/0090338 A1 | 5/2003 | Muramatsu |
| 2004/0266378 A1 | 12/2004 | Fukamachi et al. |
| 2005/0176380 A1 | 8/2005 | Okabe et al. |
| 2008/0218927 A1* | 9/2008 | Harada et al. .................. 361/119 |
| 2010/0007435 A1* | 1/2010 | Kawamoto et al. ........... 333/133 |
| 2011/0279193 A1 | 11/2011 | Furutani |

FOREIGN PATENT DOCUMENTS

| | | |
|---|---|---|
| JP | 2003-100989 A | 4/2003 |
| JP | 2003-152588 A | 5/2003 |
| JP | 2003-198325 A | 7/2003 |
| JP | 2005-223582 A | 8/2005 |
| JP | 2006-73673 A | 3/2006 |
| WO | 2010/087307 A1 | 8/2010 |

OTHER PUBLICATIONS

Official Communication issued in corresponding Japanese Patent Application No. 2013-522789, mailed on Nov. 11, 2014.

* cited by examiner

HIGH-FREQUENCY MODULE

BACKGROUND OF THE INVENTION

1. Field of the Invention

The present invention relates to a high-frequency module that includes a common antenna though which communication signals of different frequency bands can be transmitted and received.

2. Description of the Related Art

Figure 1:
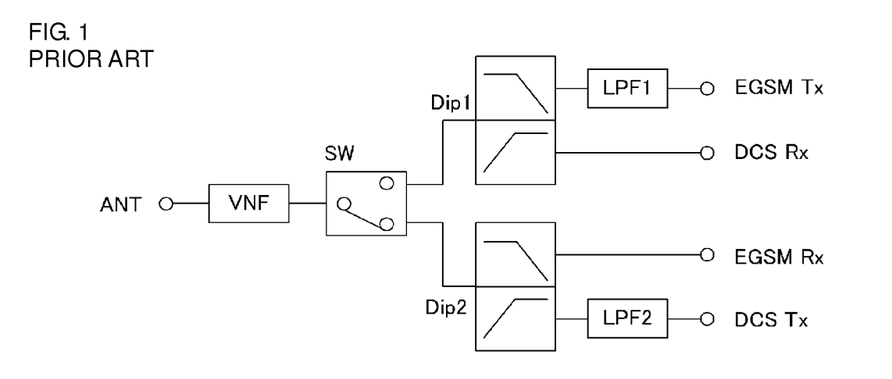
FIG. 1 is a schematic block diagram of a high-frequency module described in Japanese Unexamined Patent Application Publication No. 2003-152588.

In Japanese Unexamined Patent Application Publication No. 2003-152588, a high-frequency module is disclosed that transmits and receives communication signals of different frequency bands using a common antenna. FIG. 1 is a schematic block diagram of the high-frequency module described in Japanese Unexamined Patent Application Publication No. 2003-152588. In FIG. 1, an antenna switch circuit is illustrated.

The high-frequency module described in Japanese Unexamined Patent Application Publication No. 2003-152588 includes a switch SW and a plurality of splitters Dip1 and Dip 2. The switch SW performs switching to connect either of the transmission and reception terminals Tx and Rx of the splitter Dip1 and the transmission and reception terminals Tx and Rx of the splitter Dip2 to an antenna terminal. Thus, communication signals of different frequency bands can be transmitted and received using a single antenna.

Among such high-frequency modules, there are many that are miniaturized since they are to be used in mobile communication terminals for example. As one example of such a situation, there is a high-frequency module in which an internal electrode pattern of a multilayer body and a mount-type circuit device mounted on the multilayer body, for example, a surface acoustic wave duplexer (hereafter, SAW duplexer), are integrated with each other.

However, in a miniaturized high-frequency module, there is a problem in that the gap between the transmission and reception terminals Tx and Rx becomes smaller, interference is more likely to occur between these terminals and the characteristics of isolation of the transmission and reception terminals Tx and Rx from each other are degraded. In addition, since the transmission and reception terminals Tx and Rx utilize the same ground electrode in a multilayer substrate, there is also a problem in that a signal may travel between the transmission terminals Tx and Rx via the ground electrode, thereby degrading the characteristics of isolation of the transmission and reception terminals Tx and Rx from each other.

SUMMARY OF THE INVENTION

Accordingly, preferred embodiments of the present invention provide a high-frequency module in which degradation of the characteristics of isolation of the transmission and reception terminals of a splitter from each other is prevented.

A high-frequency module according to a preferred embodiment of the present invention includes a multilayer body including stacked dielectric layers and first and second ground conductors that are separated from each other, a common terminal that is provided in the multilayer body and to and from which communication signals are input and output, and a splitter that is mounted on a surface of the multilayer body and that separates communication signals input and output via the common terminal. The splitter includes a transmission filter that is mounted on a surface of the multilayer body and that is grounded by the first ground conductor and a reception filter that is mounted on the surface of the multilayer body and is grounded by the second ground conductor.

With this configuration, since the transmission filter and the reception filter of the splitter are respectively individually grounded by the physically different first and second ground conductors, a situation in which a signal travels between the transmission filter and the reception filter via a ground conductor is prevented. As a result, degradation of the characteristics of isolation of the transmission filter and the reception filter from each other is prevented.

In addition, the transmission filter and the reception filter of the splitter are mounted so as to be spaced apart from each other, such that the problem of degradation of the isolation characteristics caused by the gap between the transmission filter and the reception filter being small is prevented avoided.

The high-frequency module according to a preferred embodiment of the present invention may have a configuration in which a plurality of the splitters are mounted on the surface of the multilayer body, the transmission filter of each of the splitters is grounded by the same first ground conductor, and the reception filter of each of the splitters is grounded by the same second ground conductor.

With this configuration, in the case where a plurality of splitters are mounted, a ground conductor is provided for the transmission filters and a ground conductor is provided for the reception filters, such that miniaturization of the high-frequency module is realized while avoiding degradation of the isolation characteristics.

The high-frequency module according to a preferred embodiment of the present invention may have a configuration in which a plurality of the splitters are mounted on the surface of the multilayer body, and the multilayer body includes a set of the first and second ground conductors, which are separated from each other and ground the transmission filter and the reception filter, for each splitter.

With this configuration, in the case where a plurality of splitters are mounted, since a situation in which a signal travels between transmission filters or reception filters of different splitters is prevented, it is ensured that the isolation characteristics are not degraded.

It is preferable that the high-frequency module according to a preferred embodiment of the present invention has a configuration in which the multilayer body includes a common ground conductor that is in conductive contact with each of the first and second ground conductors, which are separated from each other, and that is located in the vicinity of a lowermost layer of the multilayer body.

With this configuration, in the case where the ground potentials of the transmission filter and the reception filter may change due to generation of a parasitic component between the first and second ground conductors due to the ground conductors being separated from each other, the ground potentials are prevented from changing and degradation of isolation is prevented by making the first and second ground conductors be in conductive contact with each other through a common ground conductor located in the vicinity of the lowermost layer of the multilayer body, which is closer to being an ideal ground.

The high-frequency module according to a preferred embodiment of the present invention may have a configuration in which a plurality of the splitters are mounted on the surface of the multilayer body and in which a switch device that connects any of the splitters to the common terminal is further included, the switch device being mounted on the surface of the multilayer body so as to lie between the transmission filters and the reception filters.

With this configuration, by adopting a positional relationship in which the switch device lies between the transmission filters and the reception filters, it is possible to make the distance between the transmission filters and the reception filters be just that needed to mount the switch device, and therefore degradation of isolation is avoided, the area in which the switch device is mounted is effectively used and the high-frequency module is miniaturized.

It is preferable that the high-frequency module according to a preferred embodiment of the present invention has a configuration in which the multilayer body further includes a switch ground conductor that is arranged so as to be separated from the first and second ground conductors and that grounds the switch device.

With this configuration, a situation in which a signal travels between the switch device and a splitter via a ground conductor is prevented and therefore degradation of isolation is prevented.

It is preferable that the high-frequency module according to a preferred embodiment of the present invention has a configuration in which the transmission filters of the splitters and the reception filters of the splitters are respectively arranged in the vicinities of opposite edges of the surface of the multilayer body.

With this configuration, the distance between the transmission filters and the reception filters is increased and isolation of the transmission filters and the reception filters from each other is improved.

According to various preferred embodiments of the present invention, degradation of the characteristics of isolation of transmission and reception terminals of a splitter from each other is prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereafter, preferred embodiments of a high-frequency module according to the present invention will be described while referring to the drawings. In the preferred embodiments described hereafter, a high-frequency module that performs transmission and reception of global system for mobile communications (GSM) (registered trademark) 900 communication signals, GSM1800 communication signals, GSM1900 communication signals, and communication signals of the Band 1, Band 2 and Band 5 band classes of the wideband code division multiple access (W-CDMA) communication system, in other words, performs transmission and reception of six types of communication signals, is described.

Preferred Embodiment 1

Figure 2:
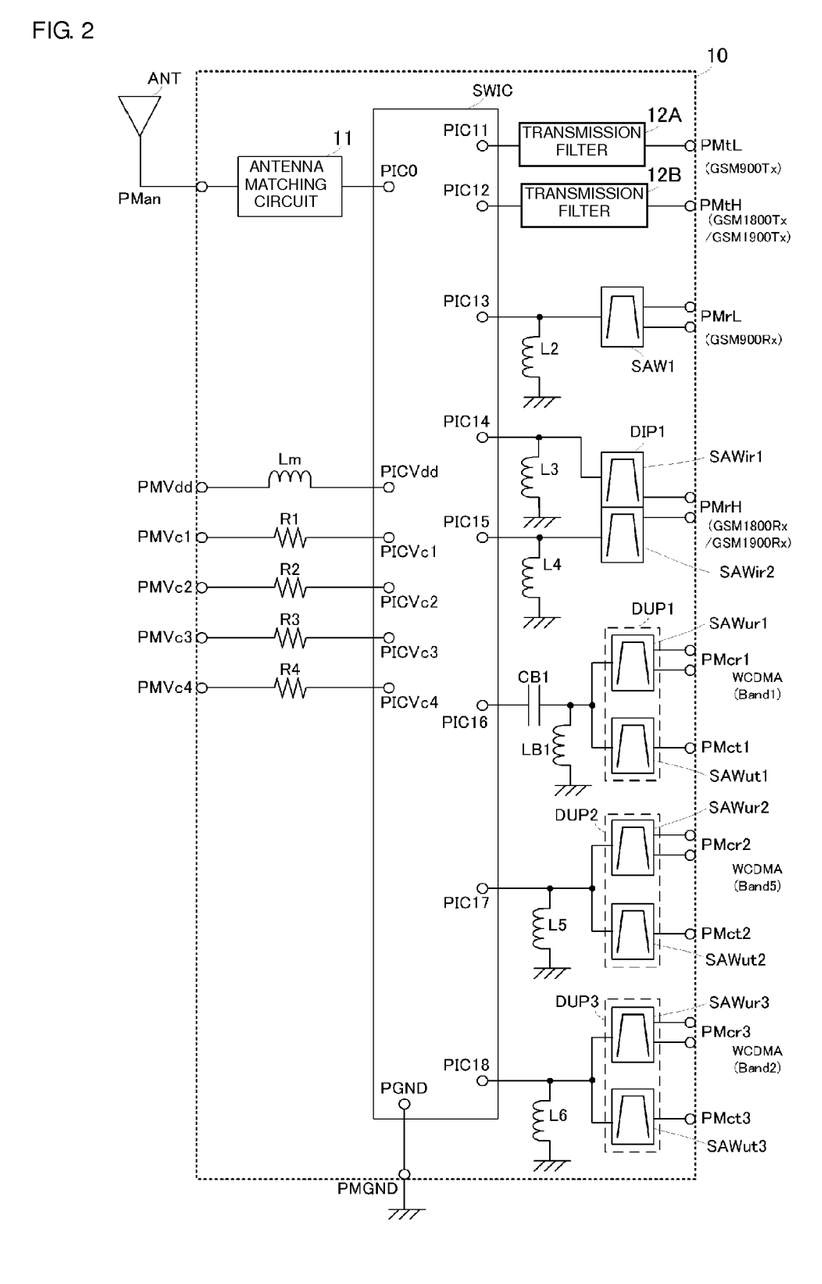
FIG. 2 is a block diagram illustrating the circuit configuration of a high-frequency module according to Preferred Embodiment 1 of the present invention.

FIG. 2 is a block diagram illustrating the circuit configuration of a high-frequency module according to Preferred Embodiment 1 of the present invention.

A switch device SWIC preferably includes a single common terminal PIC0 and eight individual terminals PIC11 to PIC18. The switch device SWIC is equipped with a ground terminal PGND that allows connection to a ground GND. The ground terminal PGND is connected to a ground port electrode PMGND, which is an external-connection port electrode of the high-frequency module 10.

The switch device SWIC preferably includes a driving voltage application terminal PICVdd and a plurality of control voltage application terminals PICVc1, PICVc2, PICVc3 and PICVc4. The driving voltage application terminal PICVdd is connected to a power supply port electrode PMVdd, which is an external-connection port electrode of the high-frequency module 10. The control voltage application terminals PICVc1, PICVc2, PICVc3 and PICVc4 are respectively connected to power supply port electrodes PWVc1, PMVc2, PMVc3 and PMVc4, which are external-connection port electrodes of the high-frequency module 10.

The switch device SWIC is driven by a driving voltage Vdd applied from the driving voltage application terminal PICVdd. The switch IC device SWIC connects the single common terminal PIC0 to any one of the eight individual terminals PIC11 to PIC18 through a combination of control voltages Vc1, Vc2, Vc3 and Vc4 respectively applied to the plurality of control voltage application terminals PICVc1, PICVc2, PICVc3 and PICVc4.

The common terminal PIC0 is connected to a port electrode PMan, which is an external-connection port electrode of the high-frequency module 10, via an antenna matching circuit 11 that doubles as an electrostatic discharge (ESD) circuit. The port electrode PMan is connected to an external antenna ANT.

The first individual terminal PIC11 is connected to a port electrode PMtL, which is an external-connection port electrode of the high-frequency module 10, via a transmission filter 12A. The port electrode PMtL is a port through which a GSM900 transmission signal is input from the outside. The transmission filter 12A is a filter circuit that attenuates second and third order harmonics of the GSM900 transmission signal and whose passband is set to the frequency band used for the GSM900 transmission signal.

The second individual terminal PIC12 is connected to a port electrode PMtH, which is an external-connection port electrode of the high-frequency module 10, via a transmission filter 12B. The port electrode PMtH is a port through which a GSM1800 transmission signal or a GSM1900 transmission signal is input from the outside. The transmission filter 12B is a filter circuit that attenuates the second and third order harmonics of a GSM1800 transmission signal and a GSM1900 transmission signal and whose passband is set to the frequency band used for the GSM1800 transmission signal and the GSM1900 transmission signal.

The third individual terminal PIC13 is connected to one terminal of a SAW filter SAW1. A matching inductor L2 is connected between a transmission line, which connects the third individual terminal PIC13 and the SAW filter SAW1 to each other, and a ground potential. The SAW filter SAW1 is a filter whose passband is set to the frequency band of a GSM900 reception signal and that has a balanced-unbalanced conversion function. The other terminals of the SAW filter SAW1 are balanced terminals and are connected to a port electrode PMrL, which is an external-connection port electrode of the high-frequency module 10.

The fourth individual terminal PIC14 is connected to one terminal of a SAW filter SAWir1 of a diplexer DIP1. A matching inductor L3 is connected between a transmission line, which connects the fourth individual terminal PIC14 and the SAW filter SAWir1 to each other, and the ground potential. The SAW filter SAWir1 is a filter whose passband is set to the frequency band of a GSM1800 reception signal and that has a balanced-unbalanced conversion function.

The fifth individual terminal PIC15 is connected to one terminal of a SAW filter SAWir2 of the diplexer DIP1. A matching inductor L4 is connected between a transmission line that connects the fifth individual terminal PIC15 and the SAW filter SAWir2 to each other, and the ground potential. The SAW filter SAWir2 is a filter whose passband is set to the frequency band of a GSM1900 reception signal and that has a balanced-unbalanced conversion function.

The SAW filters SAWir1 and SAWir2 are integrated with each other and define a single diplexer DIP1. Balanced terminals of the SAW filters SAWir1 and SAWir2 of the diplexer DIP1 are integerated with each other. The integrated balanced terminals are connected to a port electrode PMrH, which is an external-connection port electrode of the high-frequency module 10. A GSM1800 reception signal and a GSM1900 reception signal are output to the outside from the port electrode PMrH.

The sixth individual terminal PIC16 is connected to a duplexer DUP1. A capacitor CB1 is connected between the sixth individual terminal PIC16 and the duplexer DUP1 and an inductor LB1 is connected between the duplexer DUP1 side of the capacitor CB1 and the ground potential. A matching circuit is defined by the capacitor CB1 and the inductor LB1.

The duplexer DUP1 preferably includes a SAW filter SAWut1 and a SAW filter SAWur1. The SAW filter SAWut1 and the SAW filter SAWur1 are provided in separate cases. That is, the SAW filter SAWut1 and the SAW filter SAWur1 are physically spaced apart from each other. The duplexer DUP1 is equipped with two individual terminals for a single common terminal.

The passband of the SAW filter SAWut1 is set to be the frequency band used for a WCDMA(Band1) transmission signal and an attenuated band of the SAW filter SAWut1 is set to include the frequency band used for a WCDMA(Band1) reception signal. The other terminal of the SAW filter SAWut1 is connected to a port electrode PMct1, which is an external-connection port electrode of the high-frequency module 10. The port electrode PMct1 is a port to which a WCDMA(Band1) transmission signal is input from the outside.

The passband of the SAW filter SAWur1 is set to be the frequency band used for a WCDMA(Band1) reception signal and an attenuated band of the SAW filter SAWur1 is set so as to include the frequency band used for a WCDMA(Band1) transmission signal. The SAW filter SAWur1 has a balanced-unbalanced conversion function. The other terminals of the SAW filter SAWur1 are balanced terminals and are connected to a port electrode PMcr1, which is an external-connection port electrode of the high-frequency module 10. The port electrode PMcr1 is a port through which a WCDMA(Band1) reception signal is output to the outside.

The seventh individual terminal PIC17 is connected to a duplexer DUP2. An inductor L5 is connected between a certain position on a transmission line, which extends between the seventh individual terminal PIC17 and the duplexer DUP2, and the ground potential. A matching circuit is defined by this inductor L5.

The duplexer DUP2 preferably includes a SAW filter SAWut2 and a SAW filter SAWur2. The SAW filter SAWut2 and the SAW filter SAWur2 are provided in separate casings similarly to as in the duplexer DUP1. In addition, the duplexer DUP2 is equipped with two individual terminals for a single common terminal.

The passband of the SAW filter SAWut2 is set to be the frequency band used for a WCDMA(Band5) transmission signal and an attenuated band of the SAW filter SAWut2 is set so as to include the frequency band used for a WCDMA(Band5) reception signal. The other terminal of the SAW filter SAWut2 is connected to a port electrode PMct2, which is an external-connection port electrode of the high-frequency module 10. The port electrode PMct2 is a port through which a WCDMA(Band5) transmission signal is input from the outside.

The passband of the SAW filter SAWur2 is set to be the frequency band used for a WCDMA(Band5) reception signal and an attenuated band of the SAW filter SAWur2 is set to include the frequency band used for a WCDMA(Band5) transmission signal. The SAW filter SAWur2 has a balanced-unbalanced conversion function. The other terminals of the SAW filter SAWur2 are balanced terminals and are connected to a port electrode PMcr2, which is an external-connection port electrode of the high-frequency module 10. The port electrode PMcr2 is a port through which a WCDMA(Band5) reception signal is output to the outside.

The eighth individual terminal PIC18 is connected to a duplexer DUP3. An inductor L6 is connected between a certain position on a transmission line, which extends between the eighth individual terminal PIC18 and the duplexer DUP3, and the ground potential. A matching circuit is defined by this inductor L6.

The duplexer DUP3 preferably includes a SAW filter SAWut3 and a SAW filter SAWur3. The SAW filter SAWut3 and the SAW filter SAWur3 are provided in separate casings similarly to as in the duplexers DUP1 and DUP2. In addition, the duplexer DUP3 is equipped with two individual terminals for a single common terminal.

The passband of the SAW filter SAWut3 is set to be the frequency band used for a WCDMA(Band2) transmission signal and an attenuated band of the SAW filter SAWut3 is set to include the frequency band used for a WCDMA(Band2) reception signal. The other terminal of the SAW filter SAWut3 is connected to a port electrode PMct3, which is an external-connection port electrode of the high-frequency module 10. The port electrode PMct3 is a port through which a WCDMA(Band2) transmission signal is input from the outside.

The passband of the SAW filter SAWur3 is set to be the frequency band used for a WCDMA(Band2) reception signal and an attenuated band of the SAW filter SAWur3 is set to include the frequency band used for a WCDMA(Band2) transmission signal. The SAW filter SAWur3 has a balanced-unbalanced conversion function. The other terminals of the SAW filter SAWur3 are balanced terminals and are connected to a port electrode PMcr3, which is an external-connection port electrode of the high-frequency module 10. The port electrode PMcr3 is a port through which a WCDMA(Band2) reception signal is output to the outside.

Figure 3A:
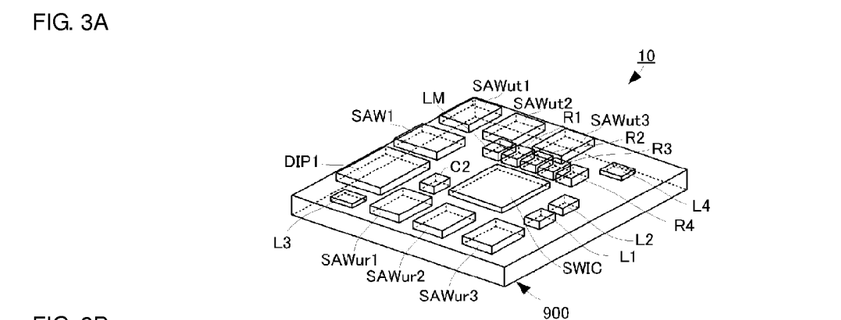
FIG. 3A is an external perspective view for explaining the structure of the high-frequency module according to Preferred Embodiment 1 of the present invention.
Figure 3B:
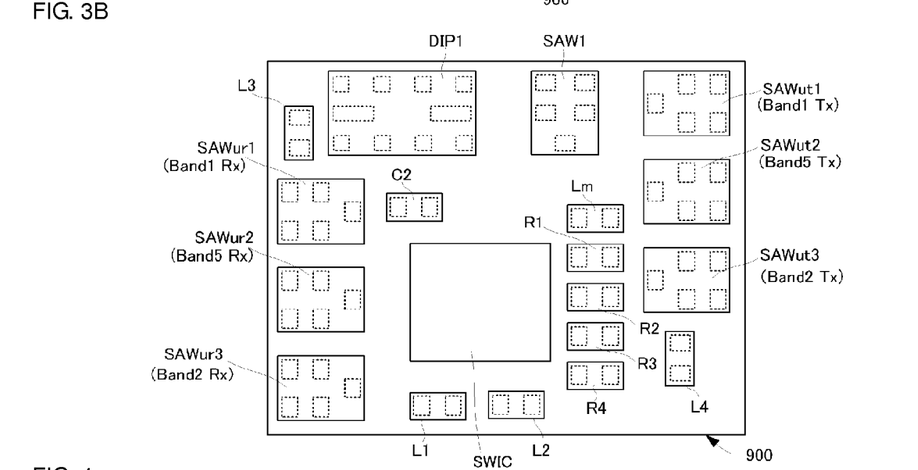
FIG. 3B is an overhead layout view for explaining the structure of the high-frequency module according to Preferred Embodiment 1 of the present invention.

FIG. 3A is an external perspective view and FIG. 3B is an overhead layout view for explaining the structure of the high-frequency module 10 according to the present preferred embodiment.

The high-frequency module 10 includes a multilayer body 900. The multilayer body 900 includes a plurality of dielectric layers stacked on top of one another and electrodes are provided on the inner layers, so as to define electrode patterns that make up the high-frequency module 10. In addition, as will be described in more detail below, the above-mentioned external-connection port electrodes are provided in a certain arrangement on a bottom surface of the multilayer body 900.

The switch device SWIC, the SAW filter SAW1, the diplexer DIP1, the SAW filters SAWut1 and SAWur1, which define the duplexer DUP1, the SAW filters SAWut2 and SAWur2, which define the duplexer DUP2, and the SAW filters SAWut3 and SAWur3, which define the duplexer DUP3, are mounted on the top surface of the multilayer body 900.

The SAW filters SAWut1 and SAWur1, which define the duplexer DUP1, are circuit devices that are implemented in individual casings. Similarly, the SAW filters SAWut2 and SAWur2, which define the duplexer DUP2, are also circuit devices that are implemented in individual casings. The SAW filters SAWut3 and SAWur3, which define the duplexer DUP3, are also circuit devices that are implemented in individual casings.

The SAW filter SAWut1, the SAW filter SAWut2 and the SAW filter SAWut3 are mounted in the vicinity of a second lateral edge (right lateral edge in FIG. 3B when looking at the surface of the paper) when the multilayer body 900 is viewed in plan. In addition, the SAW filter SAWut2 for WCDMA (Band5) is arranged between the SAW filter SAWut1 for WCDMA(Band1) and the SAW filter SAWut3 for WCDMA (Band2).

The frequency bands of transmission signals of WCDMA (Band1) and WCDMA(Band2) are close to each other. Consequently, by arranging the SAW filter SAWut1, the SAW filter SAWut2 and the SAW filter SAWut3 as described above, isolation of the WCDMA(Band1) transmission circuit and the WCDMA(Band2) transmission circuit from each other, which easily affect each other due to the frequency bands that they use being close to or partially overlapping each other, is made high.

The SAW filter SAWur1, the SAW filter SAWur2 and the SAW filter SAWur3 are mounted in the vicinity of a first lateral edge (left lateral edge in FIG. 3B when looking at the surface of the paper) opposite to the second lateral edge when the multilayer body 900 is viewed in plan. Regarding the SAW filter SAWur1, the SAW filter SAWur2 and the SAW filter ur3, the SAW filter SAWur2 for WCDMA(Band5) is arranged between the SAW filter SAWur1 for WCDMA (Band1) and the SAW filter SAWur3 for WCDMA(Band2), similarly to as for the SAW filter SAWut1 and so forth. As a result, the isolation of the WCDMA(Band1) reception circuit and the WCDMA(Band2) reception circuit, which easily affect each other, from each other is made high.

In addition, the transmission SAW filters SAWut1, SAWut2 and SAWut3 and the reception SAW filters SAWur1, SAWur2 and SAWur3 are arranged so as to be spaced apart from each other. Thus, unwanted electromagnetic coupling and electrostatic coupling between the SAW filters SAWut1 and SAWur1 is significantly reduced or prevented and isolation of the filters from each other is improved. That is, a high-power WCDMA(Band1) transmission signal does not leak toward the SAW filter SAWur1 and therefore the characteristics of the duplexer DUP1 is improved. In particular, by arranging the reception filters and the transmission filters in the vicinities of opposite edges of the multilayer body 900, isolation of the filters from each other is further improved.

Similarly, the SAW filter SAWut2 and the SAW filter SAWur2, which define the duplexer DUP2, are arranged so as to be spaced apart from each other, and the SAW filter SAWut3 and the SAW filter SAWur3, which define the duplexer DUP3, are also arranged so as to be spaced apart from each other. Thus, unwanted electromagnetic coupling between the SAW filters SAWut2 and SAWur2 and between the SAW filters SAWut3 and SAWur3 is significantly reduced or prevented and isolation of the filters from each other is improved.

That is, a high-power WCDMA(Band5) transmission signal does not leak toward the SAW filter SAWur2 and therefore the characteristics of the duplexer DUP2 are improved. In addition, a high-power WCDMA(Band2) transmission signal does not leak toward the SAW filter SAWur3 and therefore the characteristics of the duplexer DUP3 are improved.

Furthermore, the switch device SWIC is mounted between the region in which the SAW filter SAWut1, the SAW filter SAWut2 and the SAW filter SAWut3 of the duplexers DUP1, DUP2 and DUP3 are mounted, and the region in which the SAW filter SAWur1, the SAW filter SAWur2 and the SAW filter SAWur3 of the duplexers DUP1, DUP2 and DUP3 are mounted.

Thus, unwanted electromagnetic coupling between the SAW filters SAWut1 and SAWur1, which define the duplexer DUP1, is further reduced or prevented. Similarly, unwanted electromagnetic coupling and electrostatic coupling between the SAW filters SAWut2 and SAWur2, which define the duplexer DUP2, and unwanted electromagnetic coupling and electrostatic coupling between the SAW filters SAWut3 and SAWur3, which define the duplexer DUP3, is further reduced or prevented.

In addition, for example, an inductor Lm and resistors R1, R2, R3 and R4 are mounted on the top surface of the multilayer body 900. The inductor Lm and the resistors R1, R2, R3 and R4 mounted so as to be arranged between the position at which the switch device SWIC is mounted and the region in which the SAW filter SAWut1, the SAW filter SAWut2 and the SAW filter SAWut3, which are the transmission filters, are mounted, when the multilayer body 900 is viewed in plan.

By doing this, the isolation of the SAW filter SAWut1, the SAW filter SAWut2 and the SAW filter SAWut3, which are the transmission filters, and the SAW filter SAWur1, the SAW filter SAW ur2, and the SAW filter SAWur3, which are the reception filters, from each other is further improved. In addition, the isolation of the SAW filter SAWut1, the SAW filter SAWut2 and the SAW filter SAWut3, which are the transmission filters, and the switch device SWIC is also further improved.

In this case, despite the presence of the SAW filter SAWut1, the SAW filter SAWut2 and the SAW filter SAWut3, which are the transmission filters, isolation is secured for the group of power supply terminals of the switch device SWIC including the driving voltage application terminal PICVdd and the plurality of control voltage application terminals PICVc1, PICVc2, PICVc3 and PICVc4 by using the inductor Lm, and the resistors R1, R2, R3 and R4, which lie between the switch device SWIC and the group of transmission filters. Consequently, superposition of a transmission signal onto a driving voltage and a control voltage is prevented.

In addition, when mounting the inductor Lm and the resistors R1, R2, R3 and R4, the inductor Lm and the resistors R1, R2, R3 and R4 are mounted so that the terminals of the inductor Lm and the resistors R1, R2, R3 and R4 on the side connected to the external-connection port electrodes face toward the region in which the group of transmission filters are mounted. Thus, isolation is improved with more certainty and superposition of a transmission signal onto a driving voltage and a control voltage is prevented.

The diplexer DIP1 and the SAW filter SAW1, in the present preferred embodiment, are mounted along an end edge that is perpendicular or substantially perpendicular to the above-mentioned first lateral edge and second lateral edge, but may be mounted at another position in accordance with the specifications.

Figure 4:
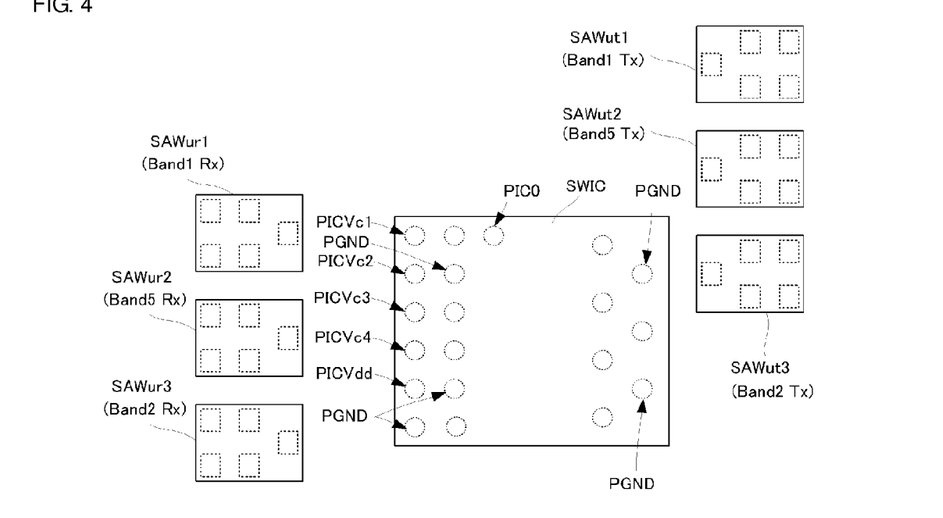
FIG. 4 illustrates the land pattern of a switch device of FIGS. 3A and 3B.

In addition, it may be preferable for the switch device SWIC to be mounted on the multilayer body 900 such that the group of power supply terminals of the switch device SWIC are on the side where the SAW filters SAWur1, SAWur2 and SAWur3, which are the reception filters, are located. FIG. 4 illustrates a land pattern of the switch device SWIC illustrated in FIG. 3A and FIG. 3B.

As illustrated in FIG. 4, the group of power supply terminals including the driving voltage application terminal PICVdd and the plurality of control voltage application terminals PICVc1, PICVc2, PICVc3 and PICVc4 of the switch device SWIC are on the side where the SAW filters SAWur1, SAWur2 and SAWur3, which are the reception filters, are located. In other words, the switch device SWIC is mounted on the multilayer body 900 such that this group of power supply terminals is located on the side opposite to the SAW filters SAWut1, SAWut2 and SAWut3, which are the transmission filters.

By doing this, the SAW filters SAWut1, SAWut2 and SAWut3, which are the transmission filters, and the group of power supply terminals are spaced apart from each other and therefore good isolation is secured therefor even in the case where the inductor Lm is not mounted. Therefore, leaking of high-power transmission signals from the SAW filters SAWut1, SAWut2 and SAWut3, which are the transmission filters, and superposition of the leaked signals onto driving voltages and control voltages input to the group of power supply terminals are prevented. Thus, the switch characteristics of the switch device SWIC such as its harmonic performance are improved.

In addition, by using the configuration of the present preferred embodiment, the external configurations of the SAW filters SAWut1, SAWut2, SAWut3, SAWur1, SAWur2 and SAWur3, which are the transmission filters and reception filters, are smaller than in the case of duplexers of the related art in which transmission filters and reception filters are integrated with each other. Thus, the degree of freedom of arrangement when mounting the individual circuit devices in the high-frequency module 10 are improved and the high-frequency module 10 is miniaturized more easily and with greater certainty.

Figure 5:
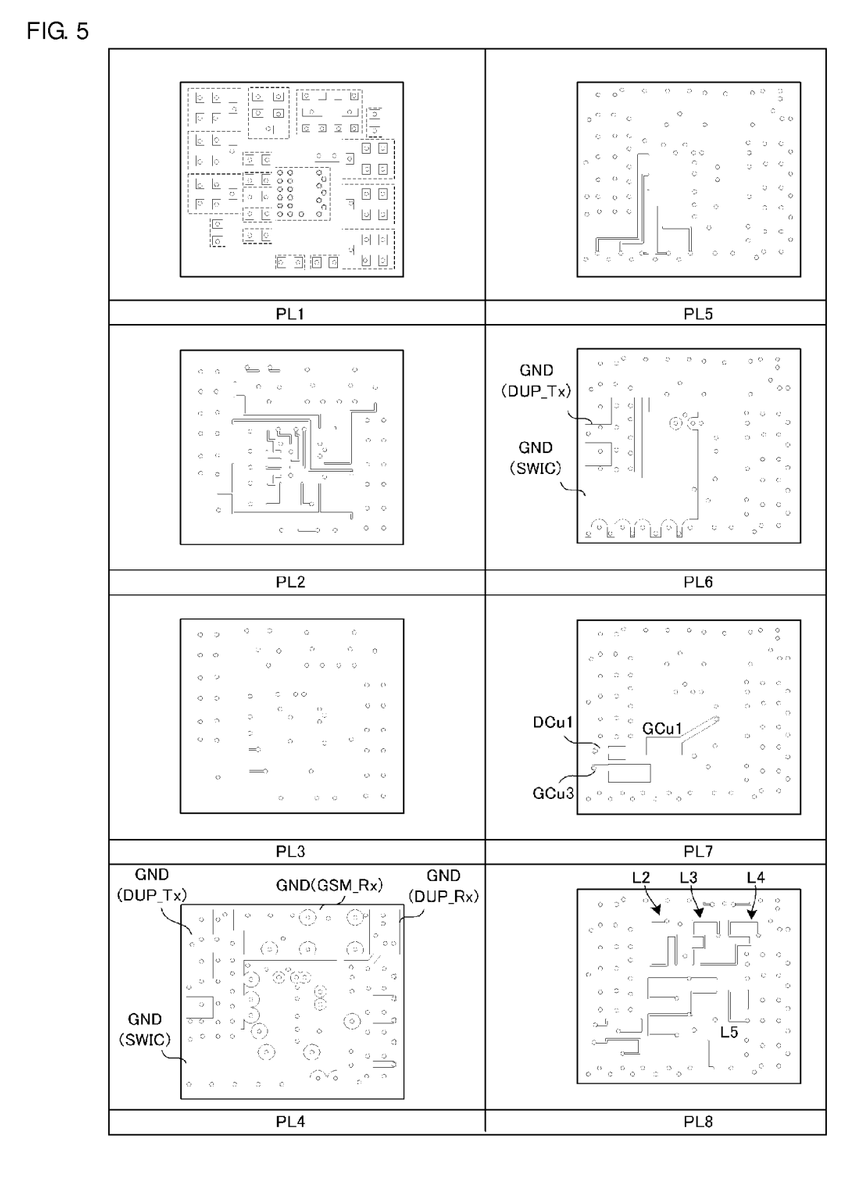
FIG. 5 illustrates the layers of the high-frequency module of Preferred Embodiment 1 of the present invention.
Figure 6:
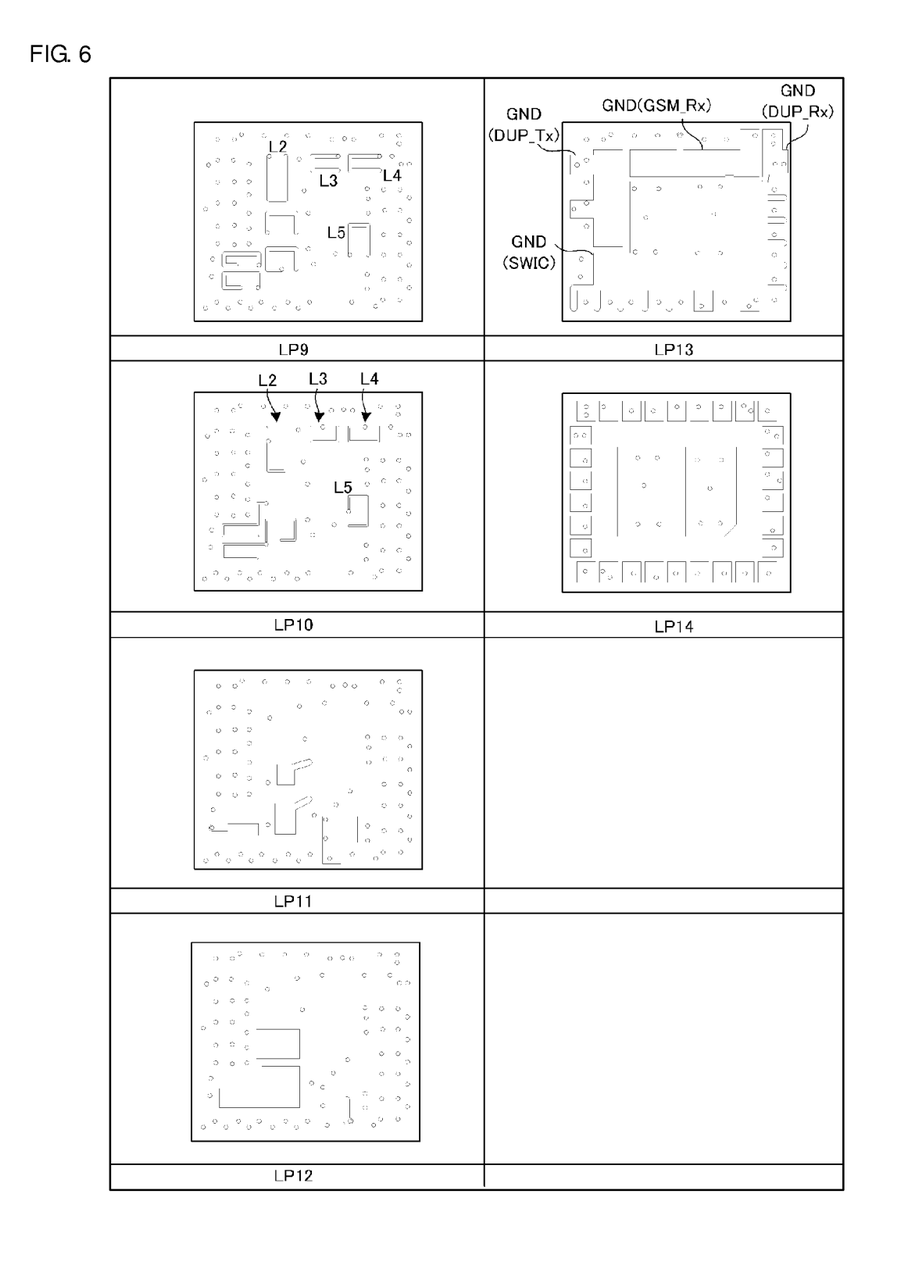
FIG. 6 illustrates the layers of the high-frequency module of Preferred Embodiment 1 of the present invention.
Figure 7A:
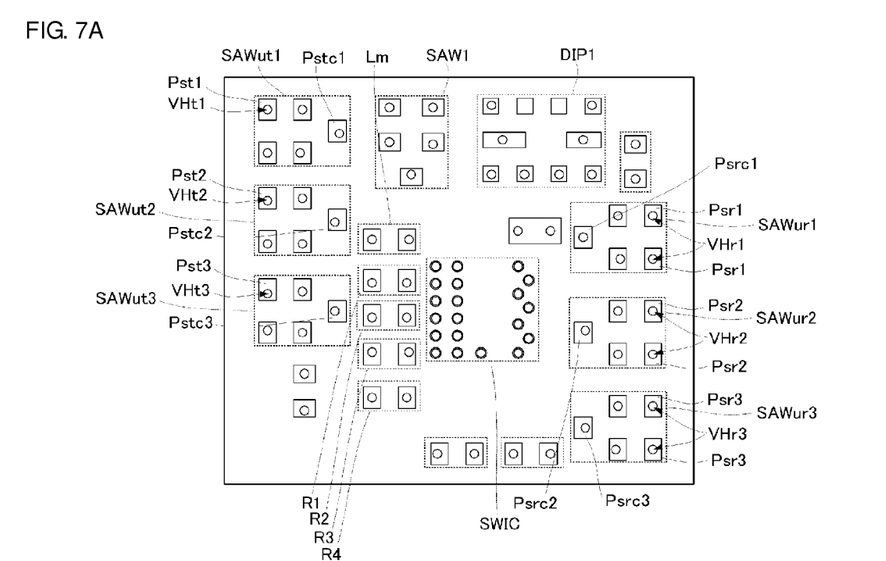
FIG. 7A illustrates the mounting state of the uppermost layer of the multilayer body of the high-frequency module of Preferred Embodiment 1 of the present invention.
Figure 7B:
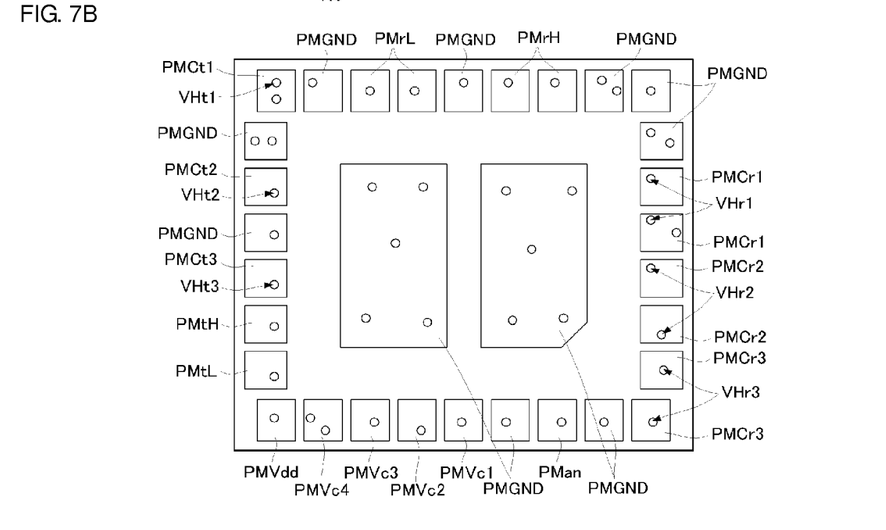
FIG. 7B illustrates an arrangement pattern of external-connection port electrodes of a lowermost layer.

FIG. 5 and FIG. 6 illustrate layers of the high-frequency module 10 of the present preferred embodiment. FIG. 5 and FIG. 6 illustrate electrode patterns when each of the dielectric layers of the multilayer body 900 is viewed from the bottom surface side. FIG. 7A illustrates a mounting state of the uppermost layer of the multilayer body 900 of the high-frequency module 10 of the present preferred embodiment and FIG. 7B illustrates the arrangement pattern of external-connection port electrodes of the lowermost layer.

The multilayer body 900 preferably includes, for example, fourteen dielectric layers stacked on top of one another, predetermined electrode patterns that define the high-frequency module 10 are provided on the dielectric layers and via electrodes that provide connections between the layers are provided in the dielectric layers. The via electrodes are represented by round marks in each layer in FIG. 5 and FIG. 6. Hereafter, description will be given while referring to the uppermost layer as a first layer PL1, with increasingly lower layers being referred to using increasingly higher numbers, until the lowermost layer which is referred to as a fourteenth layer PL14.

Device mounting electrodes, which mount the circuit devices, are located on the top surface of the first layer, which is the uppermost layer, that is, the top surface of the multilayer body 900, as described above. Guiding pattern electrodes are located on a second layer PL2 and a third layer PL3.

A ground electrode GND(DUP_Tx), a ground electrode GND(DUP_Rx), a ground electrode GND(SWIC) and a ground electrode GND(GSM_Rx) are arranged on a fourth layer PL4 so as to be physically separated from one another. The ground electrode GND(DUP_Tx) is an inner layer ground electrode for the SAW filter SAWut1, the SAW filter SAWut2 and the SAW filter SAWut3 of the corresponding duplexers DUP1, DUP2 and DUP3.

The ground electrode GND(DUP_Rx) is an inner layer ground electrode for the SAW filter SAWur1, the SAW filter SAWur2 and the SAW filter SAWur3 of the corresponding duplexers DUP1, DUP2 and DUP3. The ground electrode GND(SWIC) is an inner layer ground electrode for the switch device SWIC. The ground electrode GND(GSM_Rx) is an inner layer ground electrode for the diplexer DIP1 and the SAW filter SAW1.

A guiding electrode is located on a fifth layer PL5.

A ground electrode GND(DUP_Tx) and a ground electrode GND(SWIC) are arranged in a certain region on a sixth layer PL6. The ground electrodes GND(DUP_Tx) of the fourth layer PL4 and the sixth layer PL6 are in conductive contact with each other through a via electrode. The ground electrodes GND(SWIC) of the fourth layer PL4 and the sixth layer PL6 are in conductive contact with each other through a via electrode.

Electrode patterns of the transmission filters 12A and 12B, the antenna matching circuit 11 and each matching device are located on a seventh layer PL7, an eighth layer PL8, a ninth layer PL9, a tenth layer PL10, an eleventh layer PL11 and a twelfth layer PL12.

Similarly to as in the case of the fourth layer PL4, a ground electrode GND(DUP_Tx), a ground electrode GND(DUP_Rx), a ground electrode GND(SWIC) and a ground electrode GND(GSM_Rx) are located on a thirteenth layer PL13 so as to be physically spaced apart from one another. The ground electrodes GND(DUP_Tx) of the sixth layer PL6 and the thirteenth layer PL13 are in conductive contact with each other through a via electrode. In addition, the ground electrodes GND(DUP_Rx) of the fourth layer PL4 and the thirteenth layer PL13 are in conductive contact with each other through a via electrode. The ground electrodes GND(SWIC)

of the sixth layer PL6 and the thirteenth layer PL13 are in conductive contact with each other through a via electrode. The ground electrodes GND(GSM_Rx) of the fourth layer PL4 and the thirteenth layer PL13 are in conductive contact with each other through a via electrode.

The external-connection port electrodes are arranged on the bottom surface of the fourteenth layer PL14, which is the lowermost layer, that is, the bottom surface of the multilayer body 900. As illustrated in FIG. 7A and FIG. 7B, the port electrode PMct1 for input of a first transmission signal, the port electrode PMct2 for input of a second transmission signal, the port electrode PMct3 for input of a third transmission signal, the port electrode PMtH for input of a GSM1800/1900 transmission signal, and the port electrode PMtL for input of a GSM900 transmission signal are arranged along a second lateral edge of the fourteenth layer PL14 corresponding to the second lateral edge on the side on which the SAW filters SAWut1, SAWut2 and SAWut3, which are the transmission filters, are mounted.

At this time, the port electrode PMct1 for input of the first transmission signal and a mounting electrode Pst1 for the transmission signal input terminal of the SAW filter SAWut1 are at least partially superposed with each other when the multilayer body 900 is viewed in plan. The port electrode PMct1 and the mounting electrode Pst1 are connected to each other with just a via electrode VHt1. With this configuration, the port electrode PMct1 and the mounting electrode Pst1 are connected to each other over the shortest possible distance in the stacking direction and unwanted electromagnetic coupling with other circuit elements is not likely to occur.

In addition, the port electrode PMct2 for input of the second transmission signal and a mounting electrode Pst2 for the transmission signal input terminal of the SAW filter SAWut2 are at least partially superposed with each other when the multilayer body 900 is viewed in plan. The port electrode PMct2 and the mounting electrode Pst2 are connected to each other with just a via electrode VHt2. With this configuration, the port electrode PMct2 and the mounting electrode Pst2 are connected to each other over the shortest possible distance in the stacking direction and unwanted electromagnetic coupling with other circuit elements is not likely to occur.

In addition, the port electrode PMct3 for input of the third transmission signal and a mounting electrode Pst3 for the transmission signal input terminal of the SAW filter SAWut3 are at least partially superposed with each other when the multilayer body 900 is viewed in plan. The port electrode PMct3 and the mounting electrode Pst3 are connected to each other with just a via electrode VHt3. With this configuration, the port electrode PMct3 and the mounting electrode Pst3 are connected to each other over the shortest possible distance in the stacking direction and unwanted electromagnetic coupling with other circuit elements is not likely to occur.

These via electrodes VHt1, VHt2 and VHt3 are comparatively close to each other and extend parallel or substantially parallel to each other, and, as illustrated in the fourth layer PL4 of FIG. 5 or the thirteenth layer PL13 of FIG. 6, in the spaces between these via electrodes, there are inner layer ground electrodes and therefore unwanted electromagnetic coupling and electrostatic coupling between these via electrodes are prevented.

The ground electrodes of the fourth layer PL4 of FIG. 5 and the ground electrodes of the thirteenth layer PL13 of FIG. 6 are separated from each other on those layers and therefore interference between circuit devices due to a signal traveling therebetween via a ground electrode is significantly reduced or prevented. As a result, erroneous operation of, for example, the switching device SWIC is prevented.

In addition, since a via electrode for a WCDMA(Band5) communication signal, which has an isolated frequency band, lies between a via electrode for a WCDMA(Band1) communication signal and a via electrode for a WCDMA(Band2) communication signal, which have adjacent frequency bands, isolation of these via electrodes related to transmission signals is improved.

In addition, the port electrode PMcr1 for output of a first reception signal, the port electrode PMcr2 for output of a second reception signal and the port electrode PMcr3 for output of a third reception signal are arranged along first lateral edge of the fourteenth layer PL14 which corresponds to the first lateral edge on the side on which the SAW filters SAWur1, SAWur2 and SAWur3, which are the reception filters, are mounted.

At this time, the port electrode PMcr1 for output of the first reception signal and a mounting electrode Psr1 for the reception signal output terminal of the SAW filter SAWur1 are at least partially superposed with each other when the multilayer body 900 is viewed in plan. The port electrode PMcr1 and the mounting electrode Psr1 are connected to each other with just a via electrode VHr1. With this configuration, the port electrode PMcr1 and the mounting electrode Psr1 are connected to each other over the shortest possible distance in the stacking direction and unwanted electromagnetic coupling with other circuit elements is not likely to occur.

The WCDMA(Band1) transmission and reception circuits are widely spaced apart from each other and unwanted electromagnetic coupling therebetween is reduced or prevented with more certainty by incorporating a configuration in which the port electrode PMct1 and the mounting electrode Pst1 provided for a transmission signal of the WCDMA(Band1) as described above are connected with only the via electrode VHt1. Thus, high isolation is realized for the WCDMA (Band1) transmission and reception circuits.

In addition, the port electrode PMcr2 for output of the second reception signal and a mounting electrode Psr2 for the reception signal output terminal of the SAW filter SAWur2 are at least partially superposed with each other when the multilayer body 900 is viewed in plan. The port electrode PMcr2 and the mounting electrode Psr2 are connected to each other with just a via electrode VHr2.

With this configuration, the port electrode PMcr2 and the mounting electrode Psr2 are connected to each other over the shortest possible distance in the stacking direction and unwanted electromagnetic coupling with other circuit elements is not likely to occur. The WCDMA(Band5) transmission and reception circuits are widely spaced apart from each other and unwanted electromagnetic coupling therebetween is significantly reduced or prevented with more certainty by incorporating a configuration in which the port electrode PMct2 and the mounting electrode Pst2 provided for a transmission signal of the WCDMA(Band5) as described above are connected with only the via electrode VHt2. Thus, high isolation for the WCDMA(Band5) transmission and reception circuits is achieved.

In addition, the port electrode PMcr3 for output of the third reception signal and a mounting electrode Psr3 for the reception signal output terminal of the SAW filter SAWur3 are at least partially superposed with each other when the multilayer body 900 is viewed in plan. The port electrode PMcr3 and the mounting electrode Psr3 are connected to each other with just a via electrode VHr3.

With this configuration, the port electrode PMcr3 and the mounting electrode Psr3 are connected to each other over the shortest possible distance in the stacking direction and unwanted electromagnetic coupling with other circuit elements is not likely to occur. The WCDMA(Band2) transmission and reception circuits are widely spaced apart from each other and unwanted electromagnetic coupling and electrostatic coupling therebetween is reduced or prevented with more certainty by incorporating a configuration in which the port electrode PMct3 and the mounting electrode Pst3 provided for a transmission signal of the WCDMA(Band2) as described above are connected with only the via electrode VHt3. Thus, high isolation for the WCDMA(Band2) transmission and reception circuits is achieved.

In addition, the ground port electrode PMGND is preferably located in a central region between the port electrode PMct1, the port electrode PMct2 and the port electrode PMct3, and the port electrode PMcr1, the port electrode PMcr2 and the port electrode PMcr3 when the fourteenth layer is viewed in plan. Thus, high isolation for the transmission and reception circuits on the mounting surface is secured.

In the above-described preferred embodiment, an example was described in which a port electrode and a mounting electrode, which are to be connected to each other, are connected to each other with just a via electrode, but guiding electrodes may be defined by certain inner layer electrodes located within a range corresponding to the mounting regions of the SAW filters when viewed in plan. With this configuration, high isolation is also secured for a transmission circuit and a reception circuit of the same communication signal.

Preferred Embodiment 2

In a high-frequency module 10 according to Preferred Embodiment 2 of the present invention, the thirteenth layer PL13 of the multilayer body 900 is different from that of Preferred Embodiment 1. This difference will be described hereafter.

Figure 8:
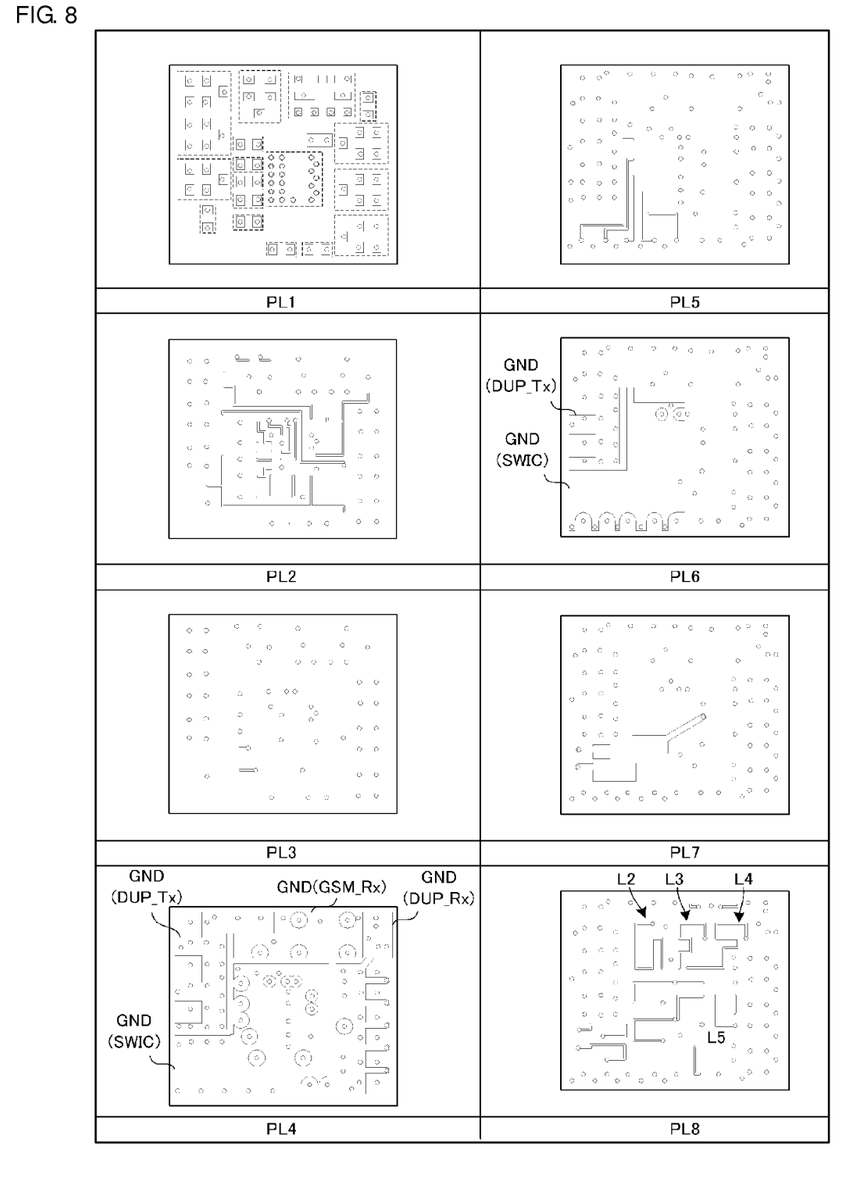
FIG. 8 illustrates the layers of a high-frequency module of Preferred Embodiment 2 of the present invention.
Figure 9:
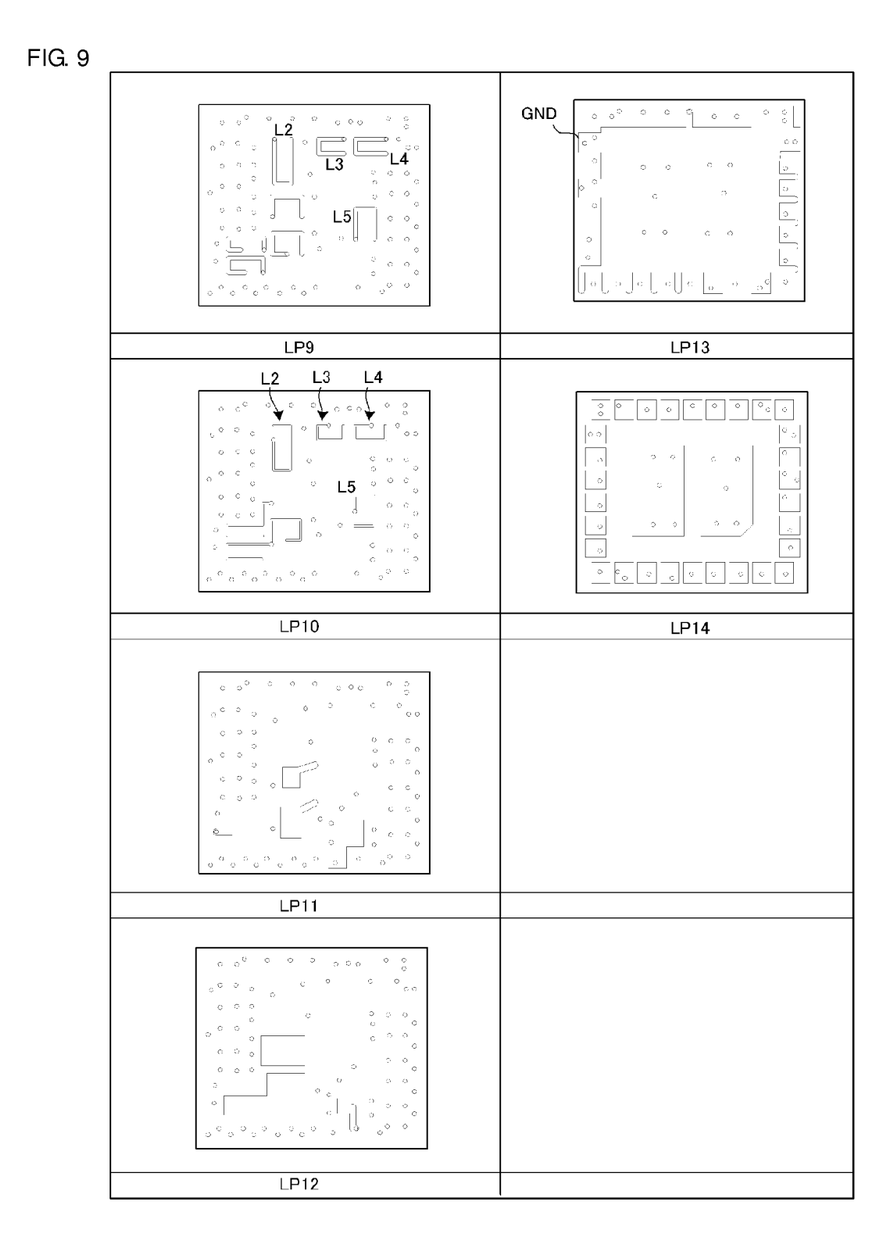
FIG. 9 illustrates the layers of a high-frequency module of Preferred Embodiment 2 of the present invention.

FIG. 8 and FIG. 9 illustrate layers of the high-frequency module 10 of the present preferred embodiment. FIG. 8 and FIG. 9 illustrate electrode patterns when each of the dielectric layers of the multilayer body 900 is viewed from the bottom surface side. In a high-frequency module 10 according to Preferred Embodiment 2, the thirteenth layer PL13 of the multilayer body 900 is different from that of Preferred Embodiment 1.

An inner layer ground electrode GND is arranged over substantially the entire surface of the thirteenth layer PL13. That is, the ground electrodes GND located on the fourth layer PL4 are separated from one another, but these ground electrodes GND are connected to the common inner layer ground electrode GND on the thirteenth layer PL13 in the vicinity of the lowermost layer. The common inner layer ground electrode GND is closer to being an ideal ground electrode as a result of being located on a layer (thirteenth layer PL13 in Preferred Embodiment 2) that is close to the lowermost layer.

Thus, in the case where a ground potential may change due to the ground electrodes on the fourth layer PL4 being separated from each other, the ground potential is prevented from changing and degradation of isolation is prevented by connecting the ground electrodes to the common inner layer ground electrode GND on the vicinity of a lowermost layer, which is close to being an ideal ground.

Preferred Embodiment 3

In a high-frequency module 10 according to Preferred Embodiment 3 of the present invention, the fourth layer PL4 of the multilayer body 900 is different from that of Preferred Embodiment 2. This difference will be described hereafter.

Figure 10:
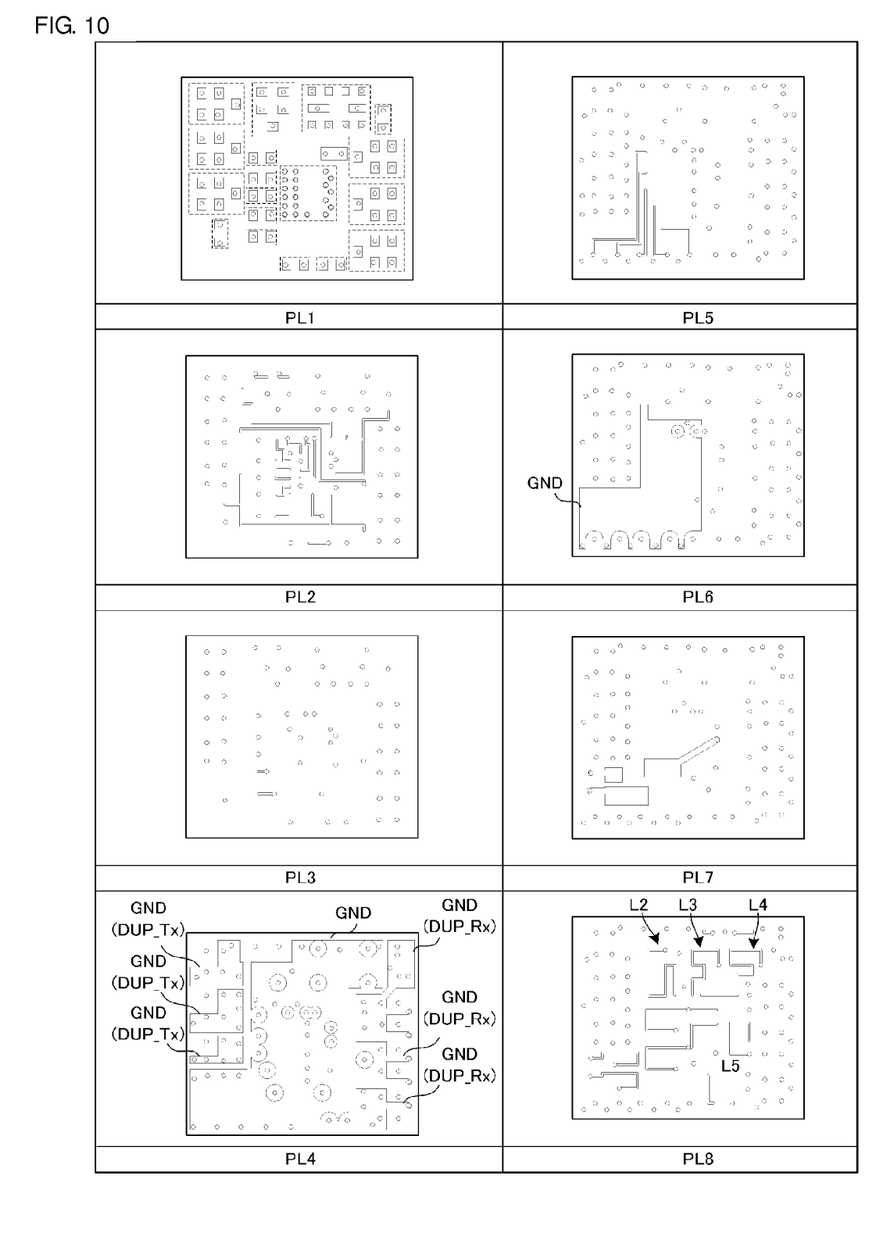
FIG. 10 illustrates the layers of a high-frequency module of Preferred Embodiment 3 of the present invention.
Figure 11:
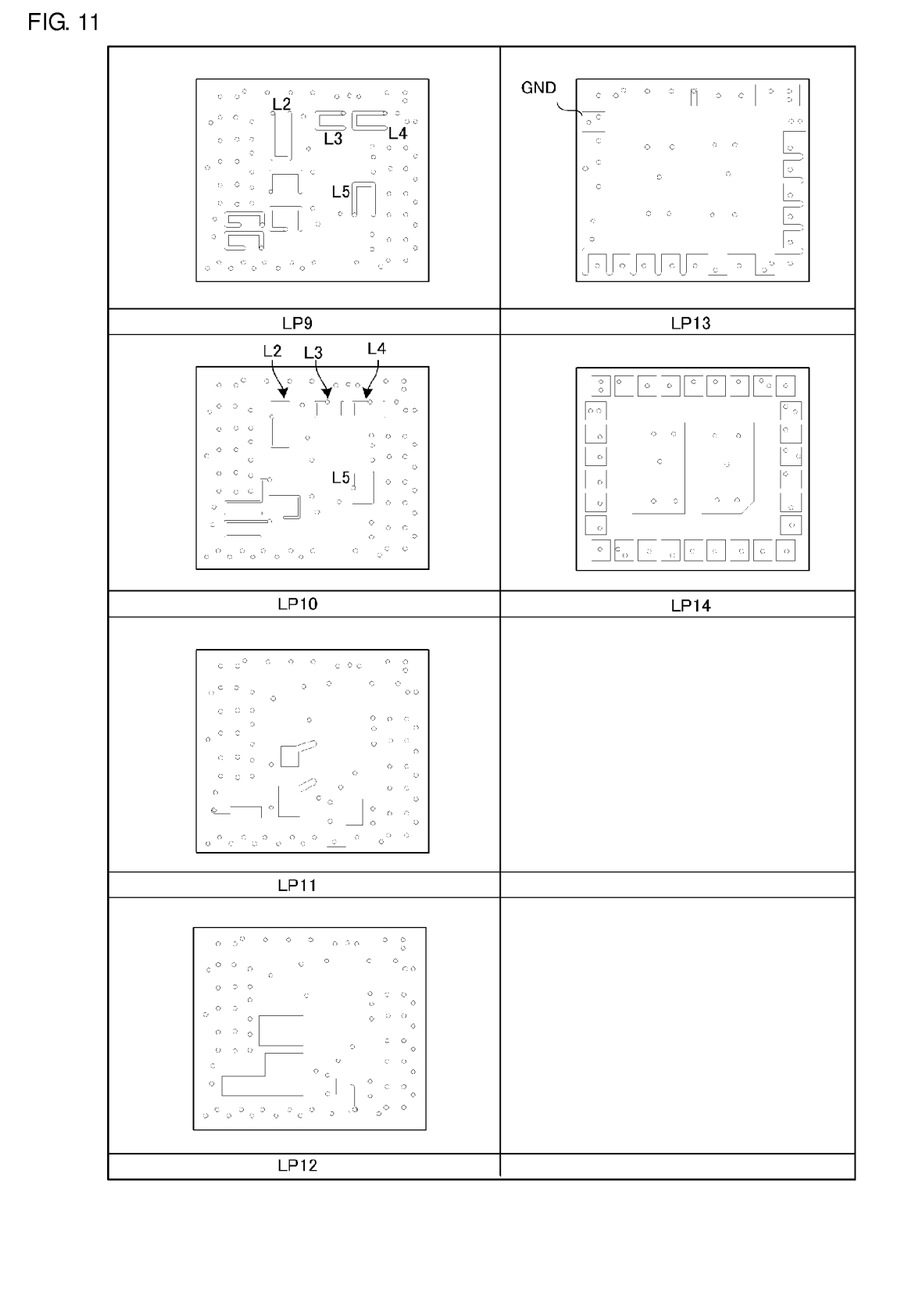
FIG. 11 illustrates the layers of a high-frequency module of Preferred Embodiment 3 of the present invention.

FIG. 10 and FIG. 11 illustrate layers of a high-frequency module 10 of the present preferred embodiment. FIG. 10 and FIG. 11 illustrate electrode patterns when each of the dielectric layers of the multilayer body 900 is viewed from the bottom surface side. In the high-frequency module 10 according to Preferred Embodiment 3, the fourth layer PL4 of the multilayer body 900 is different from that of Preferred Embodiment 2.

Ground electrodes GND(DUP_Tx) are located on the fourth layer PL4 for the SAW filters SAWut1, SAWut2 and SAWut3 of the duplexers DUP1, DUP2 and DUP3. That is, three ground electrodes GND(DUP_Tx) are located on the fourth layer PL4.

In addition, ground electrodes GND(DUP_Rx) are located on the fourth layer PL4 for the SAW filters SAWur1, SAWur2 and SAWur3 of the duplexers DUP1, DUP2 and DUP3. That is, three ground electrodes GND(DUP_Rx) are located on the fourth layer PL4.

A common inner layer ground electrode GND is located on the fourth layer PL4 for the switch device SWIC, the duplexer DIP1 and the SAW filter SAW1.

In addition, in Preferred Embodiment 3, a ground electrode GND(DUP_Tx) is not located on the sixth layer PL6.

In this way, by providing separated ground electrodes for each of the duplexers DUP1, DUP2 and DUP3, a situation in which an erroneous operation occurs due to a signal traveling between the SAW filters SAWur1, SAWur2 and SAWur3 of the duplexers DUP1, DUP2 and DUP3 via a ground electrode is prevented. Similarly, a situation in which an erroneous operation occurs due to a signal traveling between the SAW filters SAWut1, SAWut2 and SAWut3 of the duplexers DUP1, DUP2 and DUP3 via a ground electrode is prevented.

Furthermore, similarly to as in Preferred Embodiment 2, in the case where a ground potential may change due to the ground electrodes on the fourth layer PL4 being separated from each other, the ground potential is prevented from changing and degradation of isolation is prevented by connecting the ground electrodes to the common inner layer ground electrode GND in the vicinity (thirteenth layer PL13) of a lowermost layer, which is close to an ideal ground.

The specific configuration and so forth of the high-frequency module 10 can be appropriately designed and modified and the operation and effect detailed in the above-described preferred embodiments are simply an example of the most preferable operation and effect of the present invention and the operation and effect of the present invention are not limited to those detailed in the above-described preferred embodiments.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A high-frequency module comprising
   a multilayer body including dielectric layers stacked on top of one another and first and second ground conductors that are separated from each other;
   a common terminal that is provided in the multilayer body and to and from which communication signals are input and output; and a plurality of splitters that are mounted on a surface of the multilayer body and that separate the input and output communication signals via the common terminal; wherein each of the plurality of splitters includes a respective transmission filter that is mounted on the surface of the multilayer body and that is grounded by the first ground conductor and each of the plurality of splitters includes a reception filter that is mounted on the surface of the multilayer body and that is grounded by the second ground conductor.

2. The high-frequency module according to claim 1, further comprising three ground electrodes located on one of the dielectric layers of the multilayer body, wherein two of the three ground electrodes define the first and second ground conductors.

3. The high-frequency module according to claim 1, further comprising an inner layer ground electrode that defines one of the first and second ground conductors and is located on substantially an entire surface of one of the dielectric layers of the multilayer body.

4. The high-frequency module according to claim 1, further comprising a plurality of duplexers each including ground electrodes that define the first and second ground conductors and are separated from each other in the multilayer body.

5. The high-frequency module according to claim 1, wherein the multilayer body includes a common ground conductor that is in conductive contact with each of the first and second ground conductors.

6. The high-frequency module according to claim 1, wherein the high-frequency module includes a switch device that connects any of the plurality of splitters to the common terminal and the switch is mounted on the surface of the multilayer body; and the plurality of splitters and the switch device are mounted on the surface of the multilayer body such that the switch device is located between the transmission filters of the plurality of splitters and the reception filters of the plurality of splitters.

7. The high-frequency module according to claim 6, wherein the multilayer body further includes a switch ground conductor that is separated from the first and second ground conductors and that grounds the switch device.

8. The high-frequency module according to claim 1, wherein the transmission filters of the plurality of splitters and the reception filters of the plurality of splitters are respectively arranged adjacent to opposite edges of the surface of the multilayer body.

9. The high-frequency module according to claim 8, wherein the transmission filters of the plurality of splitters and the reception filters of the plurality of splitters each include surface acoustic wave filters.

10. The high-frequency module according to claim 1, wherein the high-frequency module is configured to perform transmission and reception of global system for mobile communications 900 MHz communication signals, global system for mobile communications 1800 MHz communication signals, global system for mobile communications 1900 MHz communication signals, and communication signals of the Band 1, Band 2 and Band 5 band classes of the wideband code division multiple access communication system.

11. The high-frequency module according to claim 1, further comprising a duplexer including first and second surface acoustic wave filters that define the reception filter and the transmission filter respectively of one of the plurality of splitters.

12. The high-frequency module according to claim 11, further comprising a first case containing the first surface acoustic wave filter and a second case containing the second surface acoustic wave filter.

13. The high-frequency module according to claim 1, further comprising a switch device, a diplexer, and a plurality of surface acoustic wave devices defining the transmission filters and the reception filters of the plurality of splitters and mounted on the surface of the multilayer body.

14. The high-frequency module according to claim 13, further comprising individual casings containing a respective one of the plurality of surface acoustic wave devices.

15. The high-frequency module according to claim 13, wherein the diplexer and at least one of the plurality of surface acoustic wave filters are located at an edge of the surface of the multilayer body.

16. The high-frequency module according to claim 1, wherein the high-frequency module is configured to perform transmission and reception of six different types of communication signals.

* * * * *